United States Patent
Chang et al.

[11] Patent Number: 6,020,833
[45] Date of Patent: Feb. 1, 2000

[54] METHOD AND INTERFACE CIRCUIT FOR SCANNING KEYS AND EXTERNAL RESISTORS IN KEYPAD

[75] Inventors: Herman Chang, Hsin-chu; Yueh-Mei Hou, Tao-Yuan, both of Taiwan

[73] Assignee: Holtek Semiconductor Inc., Taiwan

[21] Appl. No.: 08/961,908

[22] Filed: Oct. 31, 1997

[30] Foreign Application Priority Data

Dec. 19, 1996 [TW] Taiwan ................................. 85115720

[51] Int. Cl.$^7$ ................................................. H03M 11/00
[52] U.S. Cl. ......................... 341/26; 341/22; 340/825.79
[58] Field of Search ................... 341/26, 22; 340/825.29

[56] References Cited

U.S. PATENT DOCUMENTS

| | | | |
|---|---|---|---|
| 4,231,024 | 10/1980 | Munetsugu | 341/26 |
| 4,408,184 | 10/1983 | Ishii | 341/26 |
| 4,583,092 | 4/1986 | Saito | 341/26 |
| 4,906,993 | 3/1990 | Freeman | 341/26 |
| 5,381,142 | 1/1995 | Simmons | 341/26 |
| 5,430,443 | 7/1995 | Mitchell | 341/26 |
| 5,448,236 | 9/1995 | Shiga | 341/26 |
| 5,450,080 | 9/1995 | Irwin | 341/26 |
| 5,621,402 | 4/1997 | Spak | 341/26 |
| 5,719,597 | 2/1998 | Fong | 341/26 |

*Primary Examiner*—Michael Horabik
*Assistant Examiner*—Albert K. Wong

[57] ABSTRACT

A method and an interface circuit for scanning keys and external resistors of a keypad are disclosed. The interface circuit includes: (a) an I/O device including m output ports and n input ports for allowing a key to be set between every two ports of the I/O device to construct a key disposition and allowing external resistors to be set between each of the output ports and each of the input ports to construct an external resistor disposition; (b) a clock generator providing a clock for the I/O device for having each external resistor in the external resistor disposition and each key in the key disposition scanned in response to the clock; (c) an external resistor detector latching a first scanning result of the each external resistor and outputting a first detecting signal in response to the first scanning result for changing a preset function of a system; and (d) a key input detector latching a second scanning result of each key and outputting a second detecting signal in response to the second scanning result to identify a key of the keypad.

11 Claims, 7 Drawing Sheets

METHOD AND INTERFACE CIRCUIT FOR SCANNING KEYS AND EXTERNAL RESISTORS IN KEYPAD

FIELD OF THE INVENTION

The present invention is related to a method and an interface circuit for scanning keys and external resistors of a keypad.

BACKGROUND OF THE INVENTION

For scanning key array in the interface circuit of the conventional dialer, it needs more pins to obtain more keys. Furthermore, it is impossible to have many keys through using different ports between columns or rows.

Figure 1:
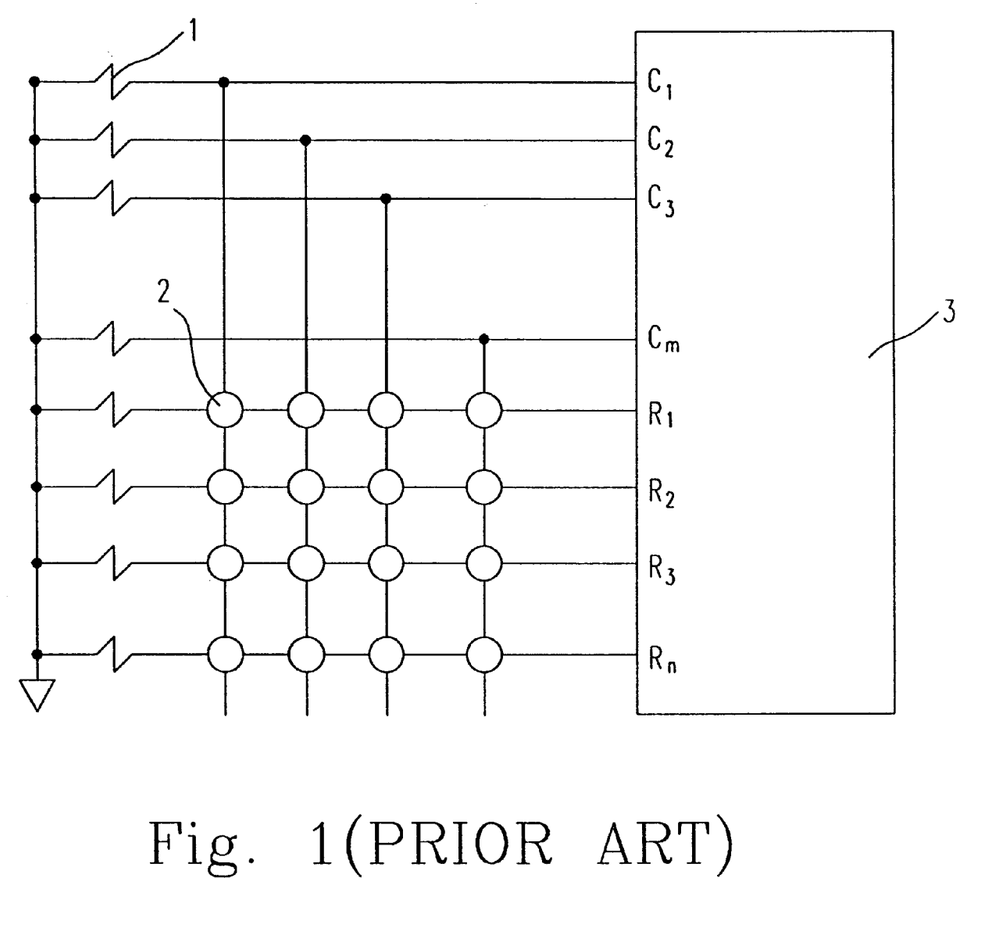
FIG. 1 shows I/O ports connected to the conventional keypad.

Please refer to FIG. 1 showing the conventional two-dimensional I/O device. The conventional I/O device includes I/O ports 3 having m columns and n rows, wherein a key 2 can be set between column i ($1 \leq i \leq M$) and row j ($1 \leq j \leq n$) so that the maximum number of keys 2 is m×n. The column group of I/O ports is responsible for outputting the scanning signals and the row group is in charge of detecting keys of the keypad. The external resistors are set between I/O ports and ground wire or in a specific position of I/O ports so that the number of the external resistor is equal to that of I/O ports. However, it will waste a lot of space over column i and row j because a key can not be set between two columns or two rows. Therefore, the maximum number of external resistors 1 to be detected is m+n in the conventional two-dimensional I/O device. In general, a telephone has more than five or six kinds of communication specifications and also includes some specific functions supplied by manufacturers so that the external resistors 1 are not sufficient for applications. The designs for the conventional two-dimensional I/O device mostly use an oscillator of 3.58 MHz as a source of system frequency. However, the oscillator of 3.58 MHz has a substantial power comsumption.

SUMMARY OF THE INVENTION

An object of the present invention is to provide an interface circuit adapted to be connected to a keypad.

A preferred embodiment according to the present invention is an interface circuit including: (a) an I/O device including a first number m of output ports and a second number n of input ports for allowing a key to be set between every two ports of the I/O device to construct a key disposition and for allowing external resistors to be set between each of the output ports and each of the input ports to construct an external resistor disposition, wherein m and n are natural numbers; (b) a clock generator electrically connected to the I/O device and providing a clock for the I/O device for having each external resistor in the external resistor disposition and each key in the key disposition scanned in response to the clock; (c) an external resistor detector latching a first scanning result of each external resistor and outputting a first detecting signal in response to the first scanning result; and (d) a key input detector latching a second scanning result of each key and outputting a second detecting signal in response to the second scanning result to identify a key of the keypad.

In accordance with one aspect of the present invention, the key disposition constructed through the I/O device has a stepped configuration.

In accordance with another aspect of the present invention, the I/O device allows a maximum of C(m+n, 2) keys to be set in the key disposition.

In accordance with another aspect of the present invention, the external resistor disposition constructed through the I/O device is a two-dimensional matrix structure.

In accordance with another aspect of the present invention, the I/O device allows a maximum of m×n external resistors to be set in the external resistor disposition.

In accordance with another aspect of the present invention, the key input detector includes: (1) a first recorder for latching the second scanning result in response to the clock; (2) a valid key detector electrically connected to the first recorder for detecting whether only one key is pressed or not in response to the latched second scanning result; and (3) a second recorder electrically connected to the valid key detector and outputting the second detecting signal in a low level state when only one key is pressed.

Another object of the present invention is to provide a method for scanning keys and external resistors through an interface circuit.

According to the present invention, the method includes steps of: a) providing an oscillation signal; b) generating the clock in response to the oscillation signal; c) scanning each external resistor in the external resistor disposition in response to the clock when a first signal is in a low level state and a second signal is in a high level state and generating the first detecting signal; and d) scanning each key in the key disposition in response to the clock after the second signal changes its level state from high to low and generating the second detecting signal to identify a key of the keypad.

In accordance with one aspect of the present invention, the oscillation signal is provided for triggering the clock generator to generate the clock.

In accordance with another aspect of the present invention, the oscillation signal is generated from a low frequency quartz oscillator.

In accordance with another aspect of the present invention, the frequency of the oscillation signal is about 32 KHz.

In accordance with another aspect of the present invention, the clock is generated from the clock generator in response to a low level state of a power on reset (POR) signal generated when the interface circuit is electrically connected to a power source.

In accordance with another aspect of the present invention, the first signal is an enabling (ENB) signal responding to a hook state and each external resistor is scanned in response to high level states of the clock and the second signal and a low level state of the enabling signal.

In accordance with another aspect of the present invention, the second signal is a control (CTRL) signal and each key is scanned in response to a high level state of the clock and a low level state of the control signal. The present invention may best be understood through the following description with reference to the accompanying drawings, in which:

DETAILED DESCRIPTION OF THE PREFERRED EMBODIMENT

In the present invention, the interface circuit includes an I/O device, a clock generator electrically connected to the I/O device, an external resistor detector, and a key input detector.

Figure 2:
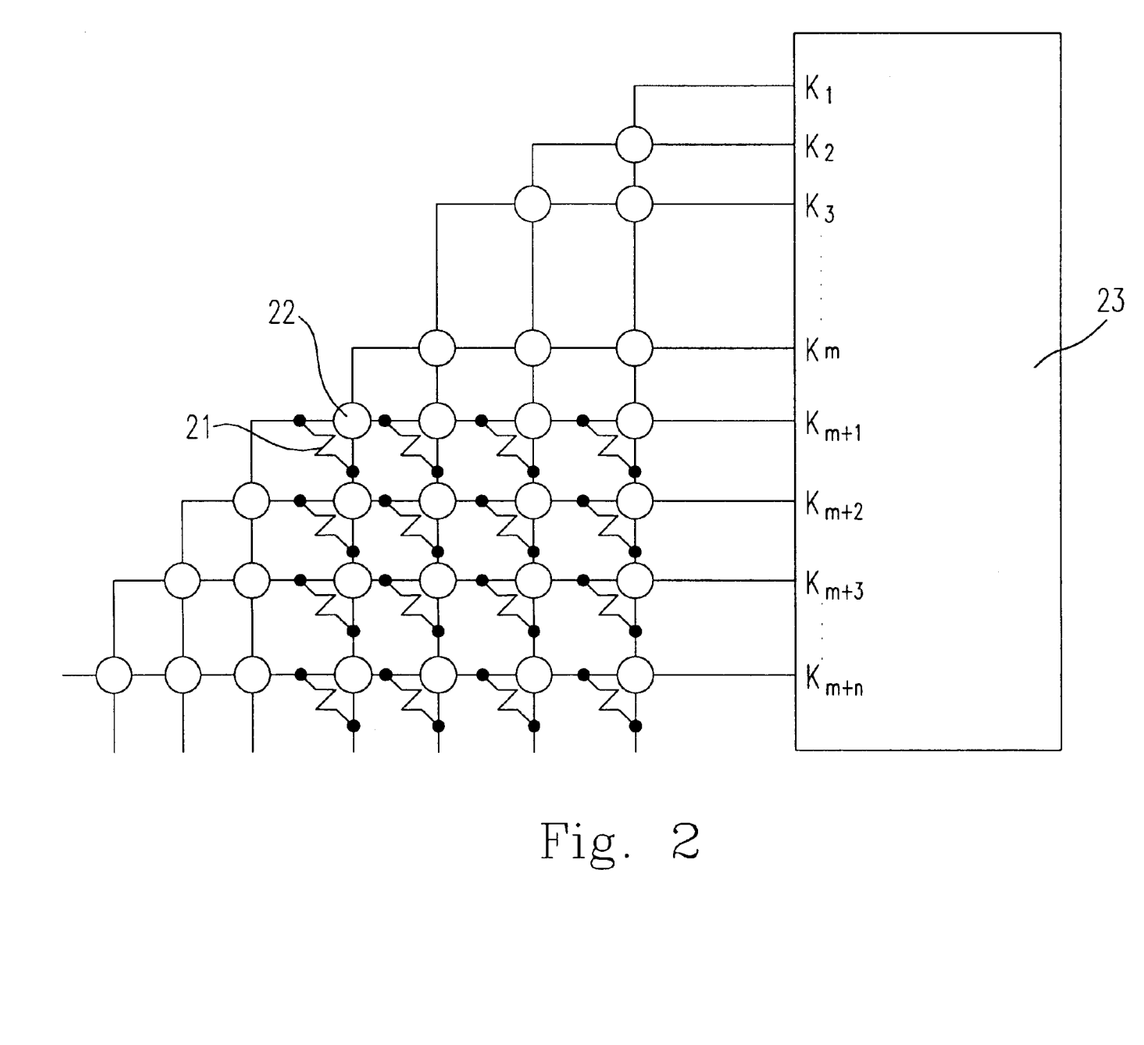
FIG. 2 is a preferred embodiment of an interface circuit for scanning keys and external resistors according to the present invention.

Please refer to FIG. 2. The I/O device 23 includes m output ports and n input ports for allowing a key 22 to be set between every two ports of the I/O device to construct a stepped configuration of key disposition and allowing external resistors 21 to be set between each of the output ports and each of the input ports to construct an external resistor disposition based on a two-dimensional matrix structure. Therefore, the I/O device 23 has m+n I/O ports and the total number of keys 22 is C(m+n, 2), that is, (m+n)×(m+n−1)/2. For example, if there are eight I/O ports, the number of keys in the conventional I/O device is 4×4=16 but that of the present invention is (8×7)/2=28.

In order to obtain the maximum number of external resistors set between each of the output ports and each of the input ports, the I/O ports is divided into group A and group B. If group A has m output ports and group B has n input ports, there are m×n external resistors. For example, if there are eight I/O ports 23, the number of external resistors of the conventional device is 4+4=8 but that of the present invention is 4×4=16.

In the present invention, a low frequency quartz oscillator of 32768 Hz is used as a source of oscillation frequency and every I/O port 23 is deemed as one dimension which is very different from that of the conventional device.

The method for scanning keys and external resistors through the interface circuit includes steps of: a) providing an oscillation signal; b) generating clock in response to the oscillation signal; c) scanning each external resistor in the external resistor disposition in response to clock and generating a first detecting signal; and d) scanning each key in the key disposition in response to clock and generating a second detecting signal to identify a key of the keypad.

Figure 4:
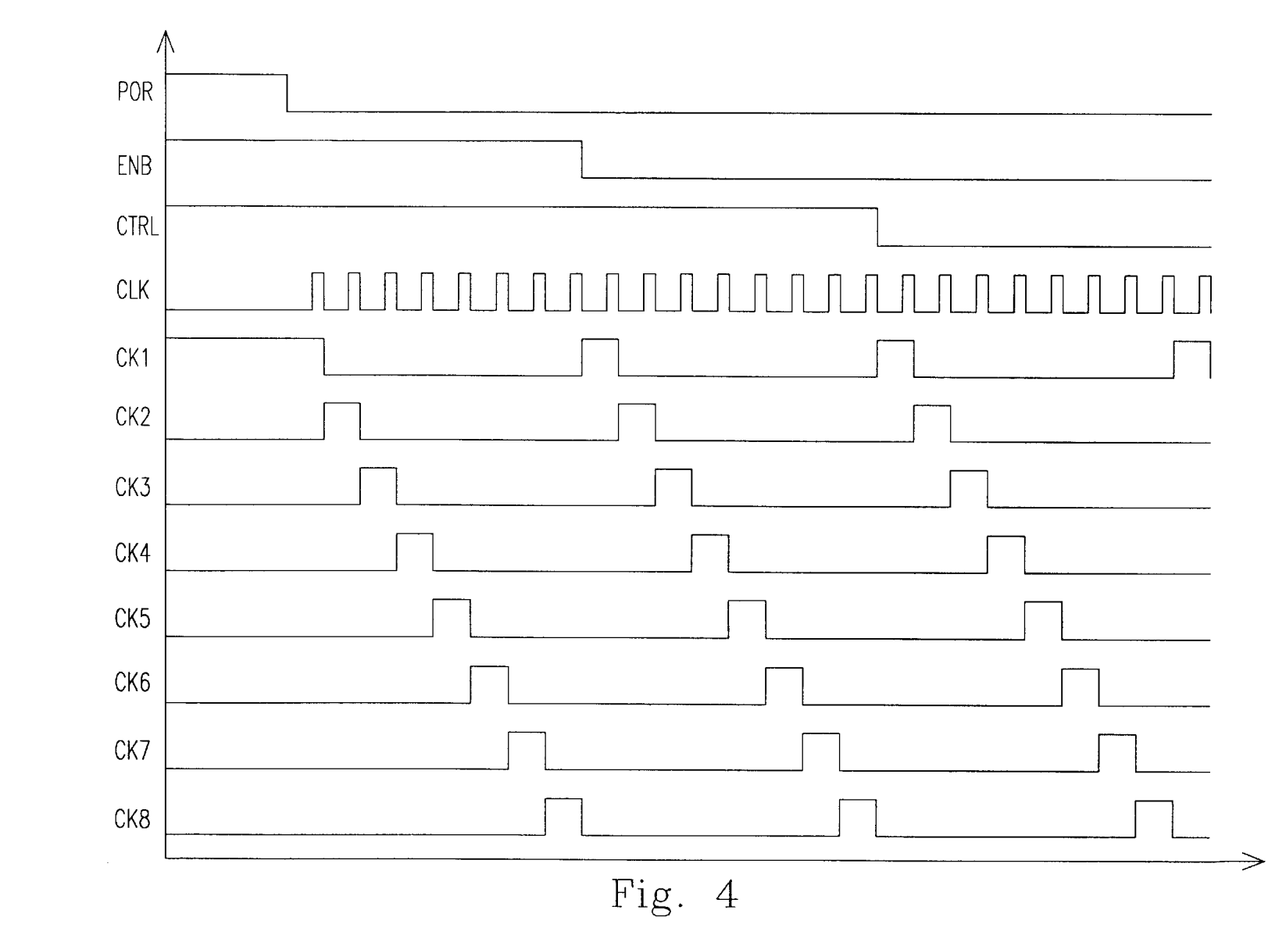
FIG. 4 is a timing diagram of a preferred embodiment according to the present invention.

In order to further understand the details of the present invention, please refer to FIG. 4. Eight I/O ports are used as an example. After the system is connected to the power source, a POR (power on reset) signal changes its level state from high to low. At the same time, the low frequency quartz oscillator generates an oscillation frequency and the clock generator generates clock (CLK) in response to the oscillation frequency. CK1~CK8 are generated after clocks (CLK) are divided. When the receiver of the dialer is taken up, an enabling signal (ENB) changes its voltage level from high to low so that the system is in an active state. Meanwhile, if the control (CTRL) signal is in the high voltage level, the external resistors will be scanned. The I/O ports 32 are divided into group A and group B, wherein group A (KP1~KP4) is in charge of outputting the scanning results of external resistors and group B (KP5~KP8) is responsible for inputting the scanning results of external resistors to an external resistor detector 34. The scanning results are stored in the external resistor detector 34 for generating an output signal. If the output signal SRij of the external resistor detector 34 is at high voltage level, it means that there is no external resistor. On the contrary, if the output signal SRij is at low voltage level, there is an external resistor.

Figure 3:
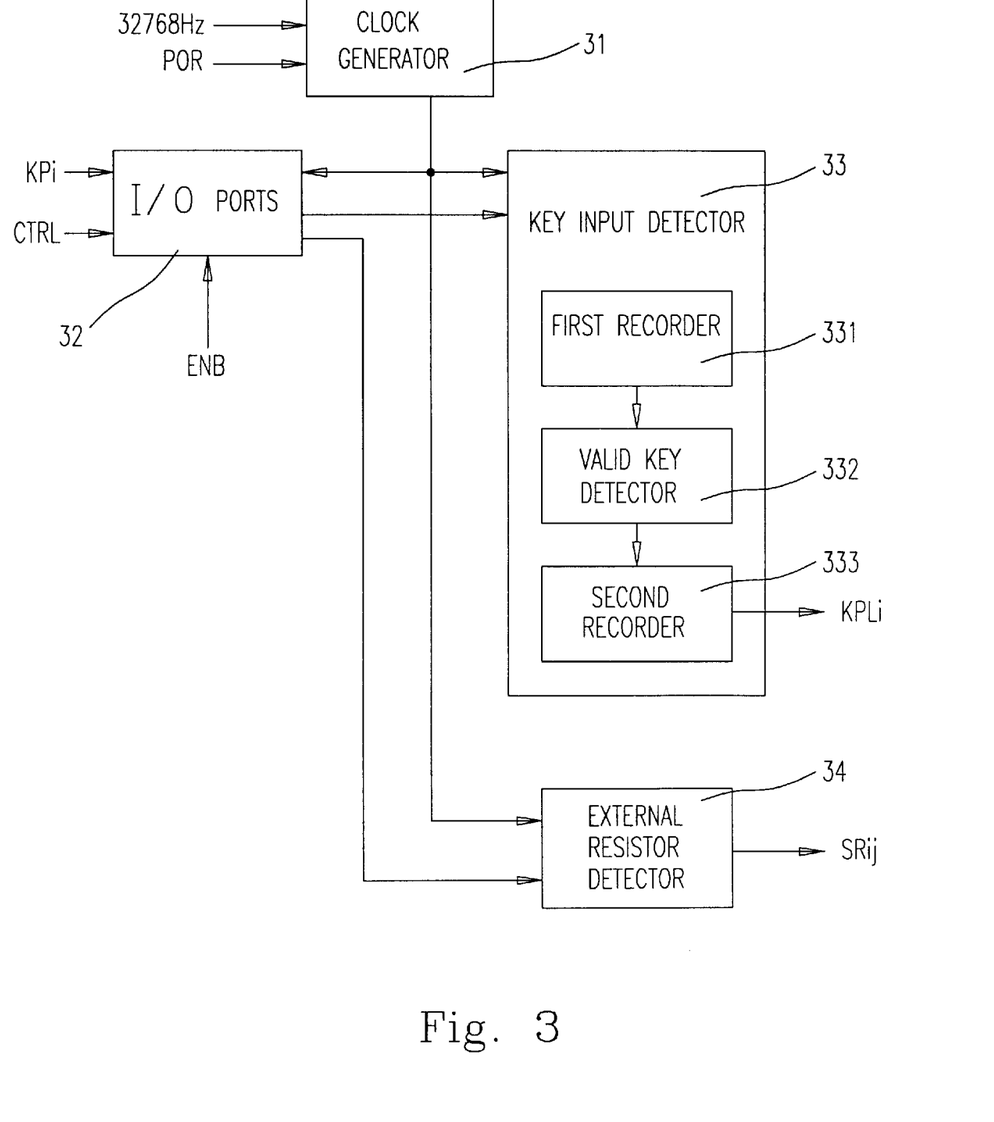
FIG. 3 is a block diagram showing a preferred embodiment of an interface circuit according to the present invention.
Figure 6:
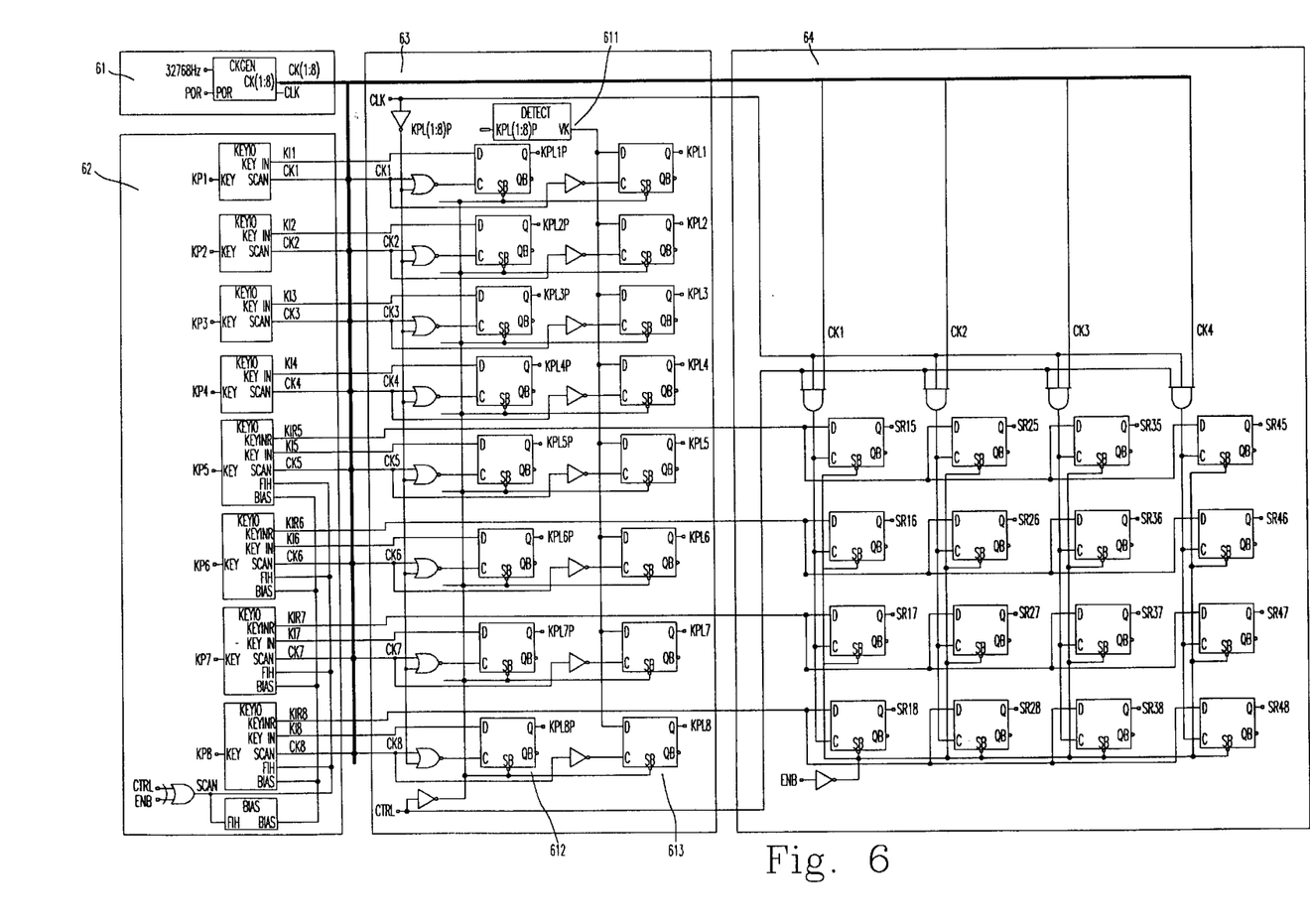
FIG. 6 shows a detail circuit of a preferred embodiment according to the present invention.

The details of scanning external resistors are described as follows:

As shown in FIG. 3, FIG. 4, and FIG. 6, KP1 of group A is at low voltage level in response to the low voltage level of CK1 while KP2~KP8 are at high voltage level. If there is one I/O port of group B connected to KP1, a low voltage level is generated and inputted into the external resistor detector 34, 64 through signals KIR5~KIR8. After CLK changes its voltage level from high to low, the first recorder of the external resistor detector 34, 64 will record the state of this low voltage level. If only KP6 is connected to KP1, the signals recorded in the external resistor detector are SR16=0 and SR15=SR17=SR18=1.

Similarly, when CK2 is at high voltage level, KP2 is at low voltage level but KP1, KP3~KP8 are at high voltage level. If there is any one I/O port of group B connected to KP2, a low voltage level is generated and inputted to the external resistor detector 34 through signals KIR5~KIR8. After CLK changes its voltage level from high to low, the second recorder of the external resistor detector 34, 64 will record the state of this low voltage level. If only KP6 is connected to KP2, the signals recorded in the external resistor detector are SR26=0 and SR25=SR27=SR28=1.

Likewise, when CK3 and CK4 are at high voltage level in order, the corresponding external resistors will be scanned and be recorded respectively.

Finally, after CK1~CK8 have been scanned, the CTRL signal changes its voltage level from high to low. It means that the steps for scanning external resistors are completed and then each key in the key disposition will be scanned.

During the steps for scanning each key in the key disposition, the I/O ports are not divided into two groups. The clock generator constantly generates CLK and each key in the key disposition is continuously scanned for identifying the key of the keypad.

The details of scanning each key are described as follows:

As shown in FIG. 3, FIG. 4, and FIG. 6, CK1 changes its voltage level from low to high, KP1 is at low voltage level but KP2~KP8 are at high voltage level. If a key connected to KP1 is pressed, KP2~KP8 change their voltage level from high to low and are inputted into the first recorder 331, 612 of the key input detector 33, 63 through signals KI2~KI8. When CLK changes its voltage level from low to high, the first recorder 331, 612 latches the states of signals KI2~KI8 and outputs signals KPL1P~KPL8P to a valid key detector 332, 611, electrically connected to the first recorder 331, 612 of the key input detector 33, 63 for detecting whether only one key is pressed or not. If only one key is pressed, the output signal from the valid key detector 332, 611 is at low voltage level (i.e. VK=0). If not, the output signal from the valid key detector 332, 611 is at high voltage level (i.e. VK=1). Thereafter, the output signal VK is inputted into a second recorder 333, 613 of the key input detector 33, 63 electrically connected to the valid key detector 332, 611. When CK1 changes its voltage level from high to low, the second recorder 333, 613 generates an output signal KPL1 in response to the state of VK and other output signals KPL2~KPL8 are still at the same state.

Similarly, when CK2 changes its voltage level from low to high, KP2 signal is at low voltage level but KP1, KP3~KP8 are at high voltage level. If a key connected to KP2 is pressed, KP1, KP3~KP8 change their voltage level from high to low and are inputted into the first recorder 331, 612 of the key input detector 33, 63 through signals KI1, KI3~KI8. When CLK changes its voltage level from low to high, the first recorder 331, 612 latches the states of signals KI1, KI3~KI8 and outputs signals KPL1P~KPL8P to a valid key detector 332, 611 for detecting whether only one key is pressed or not. If only one key is pressed, the output signal from the valid key detector 332, 611 is at low voltage level (i.e. VK=0). If not, the output signal from the valid key detector 332, 611 is at high voltage level (i.e. VK=1). Thereafter, the output signal VK is inputted into a second recorder 333, 613 of the key input detector 33, 63 electrically connected to the valid key detector 332, 611. When CK1 changes its voltage level from high to low, the second recorder 333, 613 generates an output signal KPL2 in response to the state of VK and other output signals KPL1, KPL3~KPL8 are still at the same state. After scanning CK1~CK8, the key input detector 33, 63 records a key of the keypad.

In order to further understand the step of scanning each key, a key connected to KP1 and KP3 is used as an example described as follows:

If CK1 is at high voltage level, KP1 is at low voltage level. Because the key connected to KP1 and KP3 is pressed, KP3 is also at low voltage level but KP2~KP8 are at high voltage level. KP3 is inputted into the first recorder 331, 612 through signal KI3. The original state of the first recorder 331, 612 is set at high voltage level, i.e. the state of signals KPL1P~KPL8P is specified as "11111111", wherein "1" means high voltage level. When CLK changes its voltage level from low to high, the state of signal KI3 is latched in the first recorder 331, 612 and the state of signals KPL1P~KPL8P is specified as "11011111", wherein "0" means low voltage level. However, signal KPL1P is still at high voltage level because KP1 is not scanned during CK1 is at high voltage level. The scanning results of signals KPL1P~KPL8P are transferred to the valid key detecter 332, 611 to detect whether only one key is pressed or not in response to signals KPL1P~KPL8P. If only one key is pressed, the output signal from the valid key detector is VK=0 and is inputted into a second recorder 333, 613. The original state of the second recorder 333, 613 is set at high voltage level, the state of signals KPL1P~KPL8P is specified as "1111111". When CLK changes its voltage level from low to high, the state of signals KPL1P~KPL8P is specified as "01111111"

When CK2 is at high voltage level, KP2 is at low voltage level while KP1 and KP3~KP8 are at high voltage level. As CLK changes its voltage level from low to high, the state of signals KPL1P~KPL8P in the first recorder 331, 612 is recorded as "11111111", wherein signal KPL2P is still at high voltage level because KP2 is not scanned when CK2 is at high voltage level. The scanning results of signals KPL1P~KPL8P are transferred to the valid key detector 332, 611 to detect whether only one key is pressed or not. If the output signal is VK=1, no key is pressed. When CK2 changes from high voltage level to low voltage level, the state of KPL1P~KPL8P signals is still recorded as "01111111", When CK3 is at high voltage level, KP3 is at low voltage level. Because the key connected to KP1 and KP3 is pressed, KP1 is also at low voltage level, but KP2 and KP4~KP8 are at high voltage level. When CLK changes its voltage level from low to high, the state of signals KPL1P~KPL8P is recorded as "01111111" in the first recorder 331, 612 and inputted into the valid key detector 332, 611, wherein KPL3P signal is still at high voltage level because KP3 is not scanned when CK3 is at high voltage level. The valid key detector 332, 611 detects whether only one key is pressed or not in response to signals KPL1P~KPL8P. If only one key is pressed, the output signal from the valid key detector is VK=0. When CK3 changes its voltage level from high to low, the state of signals KPL1P~KPL8P is changed to "01011111".

The scanning steps for CK4~CK8 are the same as those described as above. Consequently, the state of signals KPL1P~KPL8P is "01011111" which can identify that the key connected to KP1 and KP3 is pressed.

For obtaining the maximum number of external resistors, the I/O ports are divided into two groups. If not, one end of the external resistor is connected to I/O ports and the other end is connected to the power source (VDD) or ground wire (VSS).

Figure 5A:
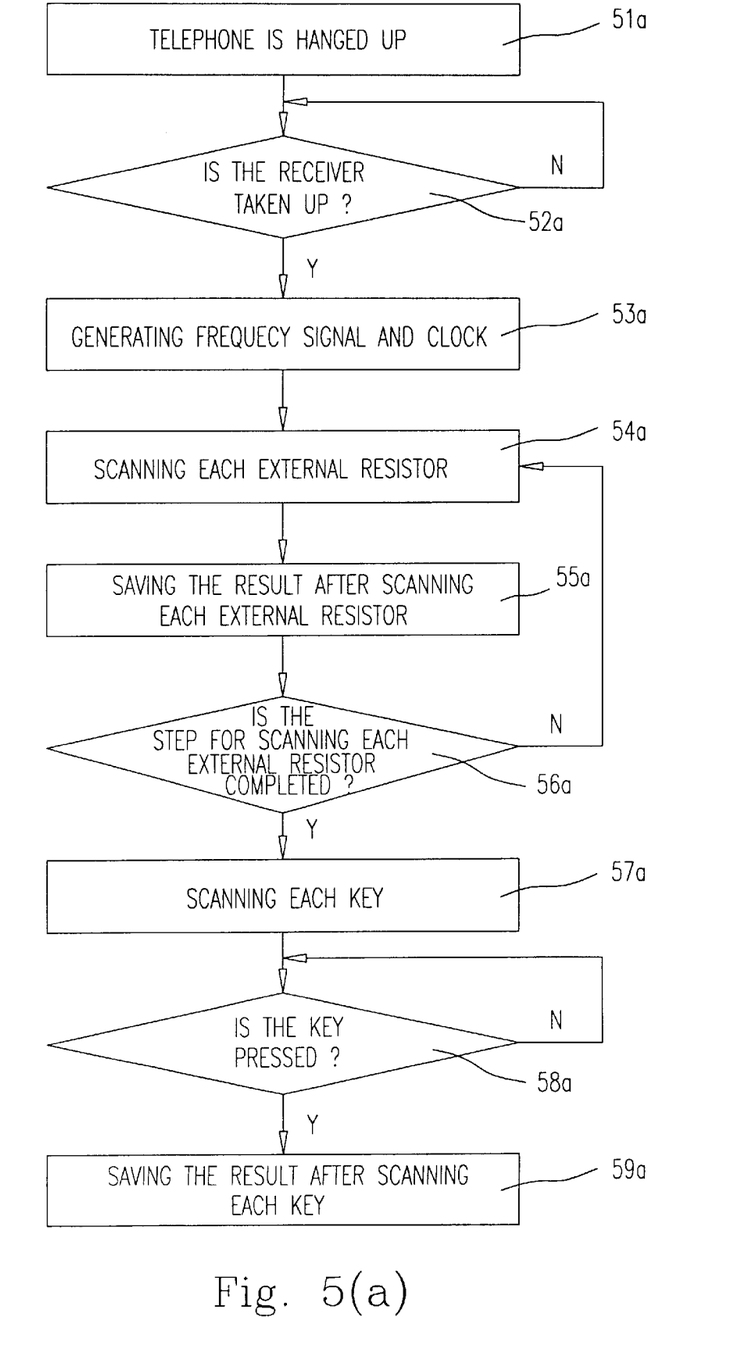
FIG. 5(a) and (b) show scanning processes according to the present invention.
Figure 5B:
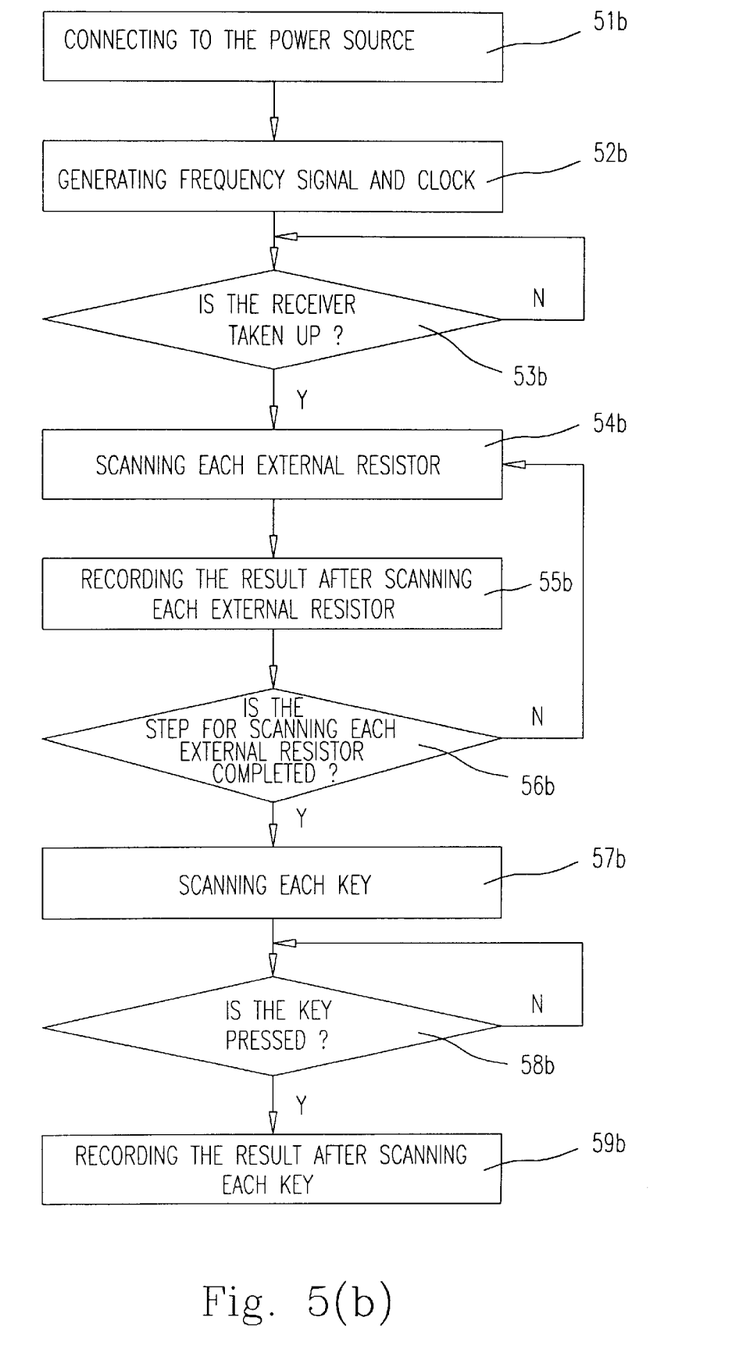

In order to clearly understand the scanning process of the present invention, please refer to FIG. 5(a) and (b). In FIG. 5(a), the scanning process is described as follows:

Step 51a: when the telephone is hanged up, the oscillator will not generate any frequency signal;
Step 52a: whether is the receiver taken up?
Step 53a: the oscillator generates a frequency signal and the clock generator generates a clock when the receiver is taken up;
Step 54a: scanning each external resistor;
Step 55a: saving the result after scanning each external resistor;
Step 56a: judging whether the steps in scanning the external resistors are completed;
Step 57a: scanning each key when the steps in scanning each external resistors are completed;
Step 58a: judging whether any one key is pressed after scanning each key;
Step 59a: saving the result after scanning each key.

The scanning process of FIG. 5(b) is described as follows:
Step 51b: connecting to the power source;
Step 52b: whether is the receiver taken up?
Step 53b: the oscillator generates a frequency signal and the clock generator generates a clock when the receiver is taken up;
Step 54b: scanning each external resistor;
Step 55b: recording the result after scanning each external resistor;
Step 56b: judging whether the step for scanning each external resistor is completed;
Step 57b: scanning each key when the step for scanning each external resistors is completed;
Step 58b: judging whether any one key is pressed after scanning each key;
Step 59b: recording the result after scanning each key.

As shown in FIG. 5(b), the clock generator 31, 61 generates clock after connected to the power source. When the receiver is taken up, each external resistor is scanned and the scanning results are recorded in the external resistor detector 34, 64. After the step for scanning each external resistor is completed, each key in the key disposition is scanned. If a key is pressed, the scanning result will be recorded in the key input detector 33, 63. The difference between FIG. 5(a) and FIG. 5(b) is that the oscillator generates a frequency signal when the receiver is taken up and stops generating the frequency signal after the telephone is hanged up in FIG. 2(a). Other steps in FIG. 2(a) are identical with those of FIG. 5 (b).

To sum up, according to the present invention, the interface circuit includes an I/O device for allowing a key to be set between every two ports of the I/O device to construct a key disposition with a stepped configuration and allowing external resistors to be set between each of the output ports and each of the input ports to construct an external resistor disposition having a two-dimensional matrix structure. Therefore, there are some feasures decribed as follows:

1. To be compared with the conventional circuit, there is a maximum number of keys obtained by the same number of pins or it needs less pins to obtain the same number of keys according to the present invention.

2. There may be more functions obtained by increasing the number of the external resistors.

3. The low frequency oscillator 32768 Hz is adopted to be used with the interface circuit according to the present invention. The power consumption of the oscillator 32768 Hz is 100 times less than that of the oscillator of 3.58 MHz used for the conventional interface circuit so that it can efficiently reduce the manufacturing cost and the power consumption and simplify the design for this interface circuit.

4. Due to low power consumption, it is unneccessary to turn down the low frequency oscillator, and hence it can constantly generate the freguency signal.

5. The present invention provides a method for scanning keys and external resistors through an interface circuit respectively so that errors can be reduced.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An interface circuit adapted to be connected to a keypad comprising:

an I/O device having a plurality of keys, a plurality of external resistors, a first number m of output ports and a second number n of input ports for allowing keys to be set between every two ports of said I/O device to construct a key disposition and allowing each of said plurality of external resistors to be set between each of said output ports and each of said input ports to construct an external resistor disposition, wherein m and n are natural numbers;

a clock generator electrically connected to said I/O device and providing a clock for said I/O device for scanning each external resistor in said external resistor disposition and each key in said key disposition in response to said clock;

an external resistor detector electrically connected to said I/O device and said clock generator for latching a first result of scanning said each external resistor and outputting a first detecting signal in response to said first result; and a key input detector electrically connected to said I/O device and said clock generator for latching a second result of scanning said each key and outputting a second detecting signal in response to said second result such that a pressed key of said keypad is identified according to said first and second detecting signals.

2. An interface circuit according to claim 1 wherein said external resistor disposition constructed through said I/O device is a two-dimensional matrix structure.

3. An interface circuit according to claim 2 wherein said I/O device allows a maximum of m×n external resistors to be set in said external resistor disposition by setting each of said plurality of external resistors between each of said output ports and each of said input ports.

4. An interface circuit according to claim 1 wherein said key input detector includes:

a first recorder for latching said second scanning result in response to said clock;

a valid key detector electrically connected to said first recorder for detecting whether only one key is pressed or not in response to said latched second scanning result; and a second recorder electrically connected to said valid key detector and outputting said second detecting signal in a low level state when only one key is pressed.

5. A method for scanning keys and external resistors through an interface circuit adapted to be connected to an external device which provides a first signal and a second signal comprising:

a) providing an oscillation signal;

b) generating a clock in response to said oscillation signal;

c) scanning each external resistor in response to said clock when said first signal is in a low level state and said second signal is in a high level state and generating a first detecting signal; and d) scanning each key in response to said clock after said second signal changes its level state from high to low and generating a second detecting signal such that a pressed key of said keypad is identified according to said first and second detecting signals.

6. A method according to claim 5 wherein in said step (a), said oscillation signal is provided for triggering a clock generator to generate said clock.

7. A method according to claim 6 wherein said oscillation signal is generated from a relatively low frequency quartz oscillator.

8. A method according to claim 7 wherein the frequency of said oscillation signal is about 32 KHz.

9. A method according to claim 5 wherein said clock is generated from a clock generator in response to a low level state of a power on reset (POR) signal generated after said interface circuit is electrically connected to a power source.

10. A method according to claim 5 wherein said first signal is an enabling (ENB) signal responding to a hook state and said each external resistor is scanned in response to said clock and a high level state of said second signal and a low level state of said enabling signal.

11. A method according to claim 10 wherein said second signal is a control (CTRL) signal and said each key is scanned in response to said clock and a low level state of said control signal.

* * * * *